United States Patent [19]
Sado

[11] 4,322,983
[45] Apr. 6, 1982

[54] METHOD FOR GENERATING ELECTRIC SIGNALS AND A PUSH-BUTTON SWITCH MEANS THEREFOR

[75] Inventor: Ryoichi Sado, Saitama, Japan

[73] Assignee: Shin-Etsu Polymer Co., Ltd., Tokyo, Japan

[21] Appl. No.: 115,223

[22] Filed: Jan. 25, 1980

[30] Foreign Application Priority Data

Feb. 2, 1979 [JP] Japan ................................. 54-11301

[51] Int. Cl.³ ............................................. G01L 1/18
[52] U.S. Cl. ................................. 73/862.68; 338/114
[58] Field of Search ....................... 73/141 R, 862.68; 323/95; 338/47, 99, 100, 114; 307/119

[56] References Cited

U.S. PATENT DOCUMENTS 3,289,065 11/1966 Dehmelt et al. ................. 307/351 X
3,629,774 12/1971 Crites .................................. 338/114
3,806,471 4/1974 Mitchell .......................... 338/99 X
4,163,204 7/1979 Sado et al. ...................... 338/100 X Primary Examiner—Charles A. Ruehl
Attorney, Agent, or Firm—Hopgood, Calimafde, Kalil, Blaustein & Judlowe

[57] ABSTRACT

The invention provides a novel push-button switching means for producing an electric signal free from the problems of chattering or bouncing unavoidable in the conventional switches relying on the principle of mechanical contacting and coming apart of the contact points. The inventive push-button switching means comprises a pressure-sensitive unit composed of a resistor body formed of an electroconductive rubbery elastomer exhibiting a minimum in its electric resistivity when subjected to compression with an increasing pushing force reaching a strength in excess of a certain critical strength and a pair of electrodes provided on the surface of the resistor body. When the pressure-sensitive unit is pushed with a force in excess of the critical strength to compress the resistor body and then released, the resistivity of the resistor body exhibits two minimum values in the courses of the pushing and releasing and, correspondingly, two maxima are obtained in the electric current through the resistor body with application of a predetermined voltage between the electrodes. These two successive peaks of current are detected by a detecting circuit which produces a single electric signal in response thereto.

6 Claims, 4 Drawing Figures

METHOD FOR GENERATING ELECTRIC SIGNALS AND A PUSH-BUTTON SWITCH MEANS THEREFOR

BACKGROUND OF THE INVENTION

The present invention relates to a method for generating electric signals and a novel push-button switching means therefor.

Many electric or electronic instruments and appliances are provided with one or more push-button switches which generate electric signals by the contacting and coming apart of the contacting terminals in the switching device. For example, an electronic pocket calculator has a key-board switch panel in which several push-button switches are arranged corresponding to the numerical figures and mathematical operators used in calculation. These push-button switches are pushed, usually, with a finger tip to operate the electronic circuit built into the calculator.

One of the important and unavoidable problems in the switching means of such a type is chattering or bouncing which may lead to erroneous operation of the electronic circuit. Accordingly, there have been made various attempts to obtain a push-button switch with little or no chattering or bouncing. An approach in obtaining such an improved switch means is the use of an electroconductive rubbery elastomer as the material for the contacting points in the switch.

Although chattering or bouncing of the switch can be greatly reduced by the use of such an electroconductive rubbery elastomer, when compared with a switching device having metallic contacting points, no satisfactory results have been obtained hitherto.

SUMMARY OF THE INVENTION

It is therefore an object of the present invention to provide a novel push-button switching means for generating electric signals, in which the problem of chattering or bouncing is totally eliminated by employing a novel and unique principle different from the mere contacting and coming apart of the contacting points.

The push-button switching means of the invention utilizes the fact that the relationship between the electric resistivity and the compression of certain kinds of electroconductive rubbery material has a negative coefficient, i.e. a smaller value of resistivity is obtained with a larger degree of compression of the rubbery elastomer, when the compression does not exceed a certain critical value. However the relationship is reversed to have a positive coefficient, i.e. the resistivity is increased with the increase in compression, when the compression exceeds the critical value (see U.S. Pat. No. 4,163,204).

When a resistor body of such an electroconductive rubbery elastomer is sandwiched between a pair of electrodes and pushed, for example, with a finger tip to an extent of the compression over the above-mentioned critical value the electric resistivity of the resistor body first decreases with the increase of the pushing force and then increases through a minimum point in the course of the increase of the pushing force. When the pushing force is released, the resistivity of the resistor body first decreases and then increases through the minimum point reaching the high base value in the uncompressed state. Therefore, when the electric current across the resistor body is recorded with application of a constant voltage between the electrodes, the oscillographic curve of the electric current vs. time has two successive peaks of about equal height corresponding to the minima in the resistivity of the resistor body. Accordingly, when a suitable electric circuit is constructed which detects the maximum in the current across the resistor body and convert it into an electric signal, there can be obtained as means for generating an electric signal without depending on the contacting or coming apart of the contacting points so that the problem of chattering or bouncing is completely solved.

DETAILED DESCRIPTION OF THE PREFERRED EMBODIMENTS

Figure 1:
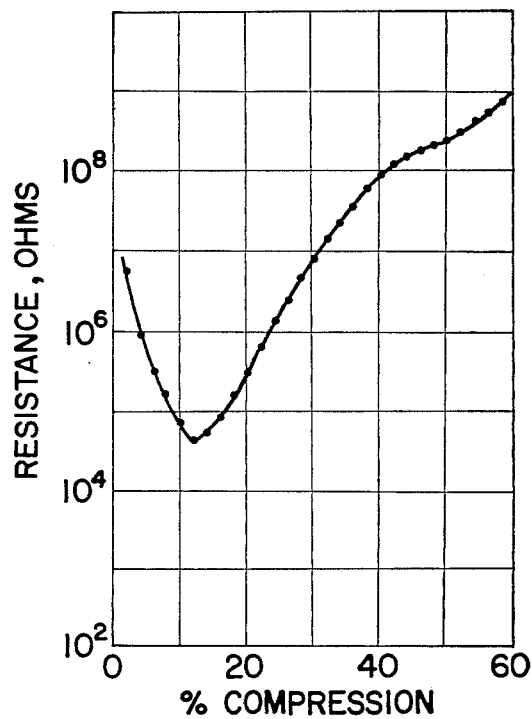
FIG. 1 is a graphic showing of the relationship between the electric resistivity of a resistor body of an electrically conductive rubbery elastomer and % compression thereof.

In the following, the principle of the inventive method and structure of the push-button switching means for generating electric signals are described in detail with reference to the drawing annexed.

The electroconductive rubbery elastomer for the resistor body in the invention is prepared by dispersing various kinds of electroconductive fillers in an electrically insulating rubbery polymer e.g. natural rubber or a synthetic rubber. It is optional that the rubbery polymer is a polymer blend of a rubber and a thermoplastic resin having elasticity. The electroconductive fillers suitable for use with the invention are exemplified by carbon black, graft polymers on carbon black, graphite powder, powders of metals or alloys, metal-plated powders of plastics or glass, powders of electroconductive organic compounds, powders of electroconductive organic polymers, powders of metal-containing complex compounds, powders of electroconductive metal oxides, powders of electroconductive metal carbides, powders of electroconductive metal carbonyls, finely disintegrated fibers of metals or carbon and the like.

The resistor body made of the above described electroconductive rubbery elastomer must have a characteristic of inversion in the relationship between the compression and the electric resistivity when compressed. In order that the electroconductive rubbery elastomer is imparted with such a characteristic of resistivity inversion, the shapes of the particles and the amount of the electroconductive filler to be added to the rubbery polymer should be determined carefully. The form of the resistor body is not particularly limitative in so far as a pair of electrodes can be bonded to or in contact with the surface thereof.

FIG. 1 shows the electric resistance of a resistor body as a function of the compression taking the distance of compression as the abscissa. The resistor body used in this measurement is a disc of 3 mm diameter and 1 mm thickness prepared by curing a silicone rubber composition (KE 151U, a product by Shin-Etsu Chemical Co., Japan) with admixture of 0.3% by weight of dicumyl peroxide as a curing agent and 9.98% by weight of a carbon black having an average particle diameter of 42 mm and a specific surface area of 61 m$^2$/g (Denka Black, a product by Denki Kagaku Kogyo Co., Japan). As is shown by the figure, the electric resistivity of the resistor body is at the minimum point with about 12% compression.

Figure 2:
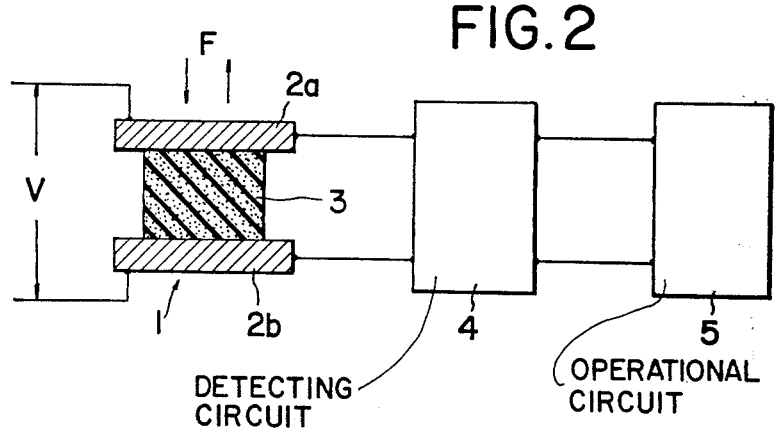
FIG. 2 is a block diagram of the inventive switching means with the pressure-sensitive unit as shown in cross section.
Figure 3:
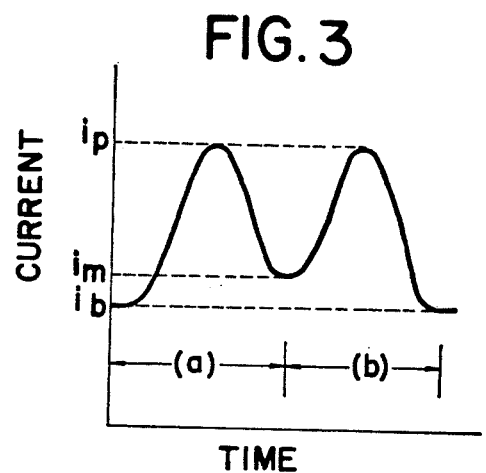
FIG. 3 is a schematic graphic depiction of the curve representing the relationship between time and electric current across the resistor body when it is first compressed with a pushing force and then the pushing force is released, the pushing force being larger than the critical strength corresponding to the minimum in resistivity.

As is shown in FIG. 2, pressure-sensitive unit 1 in the push-button switching means of the invention is constructed, for example, by providing a pair of electrodes 2a, 2b on the opposite surfaces of resistor body 3 with application of a predetermined voltage V between electrodes 2a, 2b. When resistor body 3 of pressure-sensitive unit 1 of such an arrangement is pushed, for example, with a finger tip and then released, such that the maximum strength of the pushing force F is larger than the value corresponding to the minimum resistivity of the resistor body 3, relationship between the time and the electric current across the resistor body 3 follows the curve shown in FIG. 3, in which the range (a) representing the increasing pushing force and range represents (b) the decreasing pushing force, i.e. releasing of the force. In range (a), the electric current increases starting from value $i_b$, which is the base current corresponding to the uncompressed state of resistor body 3, until reaching the peak current $i_p$ corresponding to the minimum resistivity of resistor body 3 at the inversion point. The current then decreases as the compressive force F is further increased failing to the value $i_m$. When the compressive force F is released, the electric current first increases up to the peak value $i_p$ and then decreases down to the base current $i_b$ upon complete removal of compressive force F as is shown by the curve in range (b).

As is readily understood, the values of the two peaks appearing in ranges (a) and (b) are about the same.

The time interval between these two peaks naturally depends on the touch with which the push button switch is pushed and released. At any rate, the appearance of each of the two successive peaks in the electric current can be utilized for generating an electric signal in the circuit.

FIG. 2, also illustrates the basic block diagram of the inventive push button switching means, in which each of the electrodes 2a, 2b in the pressure-sensitive unit 1 is connected electrically to a detecting circuit 4 such that when the pressure-sensitive unit 1 is pushed or released, a peak appears in the electric current across resistor body 3, the value of which is detected by the detecting circuit 4 which produces an electric signal therein which is utilized as a digital signal to drive the operational circuit 5 connected to detecting circuit 4.

Alternatively, there may be used a detecting circuit 4 capable of generating a single electric signal corresponding to the two successive peak values in the current across the resistor body 3 in the course of both increasing and releasing of the pushing force. Examples of conventional circuits to be used as detecting circuits for effecting the function of block 4 are disclosed for example in U.S. Pats. 3,509,296 and 3,386,067 which issued on Apr. 28, 1970 and May 28, 1968 respectively.

The principle with which two successive peak values in the current is converted into a single digital electric signal is well known in the art and the operating signal is produced only when the second peak value of the current is detected. Thus, the inventive push button switch means does not rely on the contacting and coming apart of the contacting points in its operating mechanism so that the problem of chattering or bouncing is totally eliminated.

Figure 4:
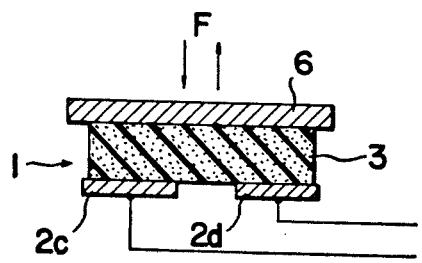
FIG. 4 is a cross sectional view of another embodiment of the pressure-sensitive unit, in which two electrodes are provided on the same side of the resistor body.

FIG. 4 shows another embodiment of the pressure-sensitive unit 1 used in the inventive push-button switching means, in which a pair of electrodes 2c, 2d are provided on one side of resistor body 3 and a pusher plate 6 is provided on the other side. The pusher plate 6 is preferably made of an electrically conductive material, e.g. a metal so that the electric connection of the electrodes 2c and 2d is obtained through the path of 2c—3—6—3—2d dually utilizing resistor body 3. Electrodes 2a, 2b in FIG. 2 and 2c, 2d in FIG. 4 are adapted to a substrate which may be rigid or flexible. It is also possible to provide more than two electrodes on one side of the resistor body to give a multi-electrode pressure-sensitive unit.

The push-button switching means of the invention may also be used in a manner described below. That is, the pressure sensitive unit 1 is first pushed to compress resistor body 3 with a pushing force F in excess of the critical strength corresponding to the minimum value of the electric resistivity the detecting circuit 4 thereby produces an electric signal when the first peak in the current is detected to drive the operational circuit 5, and the pressure-sensitive unit 1 is clamped by suitable means to maintain the compressed state. Examples of conventional circuits to be used as operational circuits for effecting the functions of block 5 are disclosed in the art, as for example, Electronics, June 23, 1977, pages 129-131. When the clamping is released, there appears a second peak in the current across the resistor body 3 whereby the detecting circuit 4 produces another electric signal with which the operation of the circuit 5 is interrupted. With this construction of the detecting circuit 4, the inventive push button switching means can be a substitute for conventional toggle switches, slide switches, two-step push button switches and the like without the problems of the chattering or bouncing.

It is noted that the push-button switching means of the invention does not operate at all when the pushing force is so small that the threshold strength of the pushing force, corresponding to the minimum in the resistivity of resistor body 3, is not exceeded.

The above-mentioned multi-electrode pressure-sensitive unit can be utilized for producing a plurality of successive digital signals when provided with a suitable mechanism for the successive pushing and releasing.

The push-button switching means as an apparatus for generating signals are very useful as input terminals in computers, microcomputers, multi-term input apparatus, printing-out units, electronic music instruments and the like.

What is claimed is:

1. A push-button switching means for producing an electric signal which comprises a resistor body formed of an electrically conductive rubbery elastomer capable of exhibiting an inversion of the electric resistivity thereof with a minimum value of the resistivity when a compressive force applied thereto is varied, at least two electrodes provided on the surface of the resistor body, and a detecting circuit electrically connected to the electrodes and capable of producing an electric signal in response to the maximum value in the electric current between the electrodes across the resistor body.

2. The push-button switching means as claimed in claim 1 wherein two electrodes are provided on the opposite surfaces of the resistor body.

3. The push-button switching means as claimed in claim 1 wherein two electrodes are provided on the same side of the surfaces of the resistor body.

4. A method for producing an electric signal which comprises pushing a pressure-sensitive unit composed of a resistor body formed of an electrically conductive rubbery elastomer capable of exhibiting an inversion in the electric resistivity thereof with a minimum value of the resistivity when a compressive force applied thereto is varied and at least two electrodes provided on the surface of the resistor body with a pushing force larger than the force corresponding to the inversion of the electric resistivity of the resistor body whereby the electric current between the electrodes across the resistor body exhibits a maximum value, a constant voltage being applied between the electrodes, detecting the peak value in the electric current and converting the thus detected peak value in the electric current into an electric signal.

5. A method for producing an electric signal which comprises releasing a pushing force applied to a pressure-sensitive unit composed of a resistor body formed of an electrically conductive rubbery elastomer capable of exhibiting an inversion in the electric resistivity thereof with a minimum value of the resistivity when a compressive force applied thereto is varied and at least two electrodes provided on the surface of the resistor body under compressed state with a pushing force larger than the force corresponding to the inversion of the electric resistivity of the resistor body whereby the electric current between the electrodes across the resistor body exhibits a maximum value, a constant voltage being applied between the electrodes, detecting the peak value in the electric current and converting the thus detected peak value in the electric current into an electric signal.

6. A method for producing an electric signal which comprises pushing a pressure-sensitive unit composed of a resistor body formed of an electrically conductive rubbery elastomer capable of exhibiting an inversion in the electric resistivity thereof with a minimum value of the resistivity when a compressive force applied thereto is varied and at least two electrodes provided on the surface of the resistor body with a pushing force larger than the force corresponding to the inversion of the electric resistivity of the resistor body whereby the electric current between the electrodes across the resistor body exhibits a first maximum value, a constant voltage being applied between the electrodes, releasing the pushing force whereby the electric current between the electrodes across the resistor body exhibits a second maximum value, detecting the two successive maximum values in the electric current across the resistor body, and converting the detected two successive maximum values of the electric current into an electric signal.

* * * * *